US008861287B2

(12) United States Patent
Shimizu et al.

(10) Patent No.: US 8,861,287 B2
(45) Date of Patent: Oct. 14, 2014

(54) INTERFACE CIRCUIT

(75) Inventors: Yuui Shimizu, Kanagawa (JP); Masaru Koyanagi, Tokyo (JP); Yasuhiro Suematsu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 68 days.

(21) Appl. No.: 13/616,609

(22) Filed: Sep. 14, 2012

(65) Prior Publication Data
US 2013/0242664 A1 Sep. 19, 2013

(30) Foreign Application Priority Data

Mar. 6, 2012 (JP) ................................. 2012-048889

(51) Int. Cl.
*G11C 7/10* (2006.01)
*G11C 16/24* (2006.01)
*H03K 19/003* (2006.01)
*H03K 19/0175* (2006.01)
*G11C 16/26* (2006.01)

(52) U.S. Cl.
CPC ........ *H03K 19/017509* (2013.01); *G11C 16/24* (2013.01); *H03K 19/00361* (2013.01); *G11C 7/1057* (2013.01); *G11C 16/26* (2013.01)
USPC ............. 365/189.05; 365/185.18; 365/185.05

(58) Field of Classification Search
CPC ...... G11C 16/26; G11C 16/24; G11C 7/1057; G11C 16/30
USPC ............. 365/185.18, 185.05, 185.23, 189.05, 365/230.06, 230.08; 326/27; 327/108, 170, 327/333
See application file for complete search history.

(56) References Cited

U.S. PATENT DOCUMENTS

| 4,961,010 | A | 10/1990 | Davis |
| 5,111,075 | A | 5/1992 | Ferry et al. |
| 5,315,172 | A | 5/1994 | Reddy |
| 6,654,310 | B2 * | 11/2003 | Nam ........................ 365/230.06 |
| 6,687,166 | B1 * | 2/2004 | Takahashi et al. ........ 365/189.05 |
| 7,005,903 | B2 * | 2/2006 | Chan et al. .................... 327/170 |
| 7,425,849 | B2 * | 9/2008 | Gupta et al. .................. 327/112 |
| 8,390,315 | B1 * | 3/2013 | Wang et al. ..................... 326/27 |

FOREIGN PATENT DOCUMENTS

| JP | 5-191241 | 7/1993 |
| JP | 5-227003 | 9/1993 |
| JP | 9-73788 | 3/1997 |
| JP | 2002-152028 | 5/2002 |
| JP | 2002-152030 | 5/2002 |
| JP | 2011-96295 | 5/2011 |

OTHER PUBLICATIONS

L. Yang, et al., "Output Buffer Design for Low Noise and Load Adaptability", IEE Proc.—Circuits Devices Syst., vol. 152, No. 2, Apr. 2005, pp. 146-150.
Office Action mailed Jun. 17, 2014, in Japanese Patent Application No. 2012-048889 (with English-language translation).

* cited by examiner

*Primary Examiner* — Gene Auduong
(74) *Attorney, Agent, or Firm* — Oblon, Spivak, McClelland, Maier & Neustadt, L.L.P.

(57) ABSTRACT

According to an embodiment, an interface circuit is provided with an output buffer which generates an output waveform on the basis of the ON/OFF operation of a transistor and a driver circuit which drives the transistor and is capable of independently changing a turn-ON speed and a turn-OFF speed of the transistor.

22 Claims, 9 Drawing Sheets

TIME

FIG.10

☐ VssQ
☐ VccQ
☐ DQ[0]
☐ DQ[1]
☐ DQ[2]
☐ DQ[3]
☐ VssQ
☐ VccQ
☐ DQS
☐ /DQS
☐ VssQ
☐ VccQ
☐ DQ[4]
☐ DQ[5]
☐ DQ[6]
☐ DQ[7]
☐ VssQ
☐ VccQ
☐ RE
☐ /RE
☐ VREF
☐ VCC
☐ VSS
☐ /CE
☐ CLE
☐ ALE
☐ /WE
☐ /WP
☐ RB

US 8,861,287 B2

INTERFACE CIRCUIT

CROSS-REFERENCE TO RELATED APPLICATIONS

This application is based upon and claims the benefit of priority from Japanese Patent Application No. 2012-48889, filed on Mar. 6, 2012; the entire contents of which are incorporated herein by reference.

FIELD

Embodiments described herein relate generally to an interface circuit.

BACKGROUND

In semiconductor chips such as NAND flash memories, the speed of an interface which exchanges data with a controller chip and the like has been increased. Such an interface is used in various forms, so that a plurality of chips are stacked and used, a plurality of packages are used by being connected to the same bus, or different wiring is used between a memory chip and a controller chip which controls the memory chip. In order to achieve a desired high-speed operation under such various environments, an output buffer is designed to optimize an output waveform by controlling the slew rate of an off-chip driver (OCD).

BRIEF DESCRIPTION OF THE DRAWINGS

FIG. 10 is a diagram illustrating an example of the pin arrangement of the semiconductor chip CP1 of FIG. 9.

DETAILED DESCRIPTION

According to an interface circuit of an embodiment, an output buffer and a driver circuit are provided. The output buffer generates an output waveform on the basis of the ON/OFF operation of a transistor. The driver circuit drives the transistor and is capable of independently changing a turn-ON speed and a turn-OFF speed of the transistor.

Hereinafter, an interface circuit according to embodiments will be described with reference to the drawings. The invention is not limited to the embodiments.

First Embodiment

Figure 1:
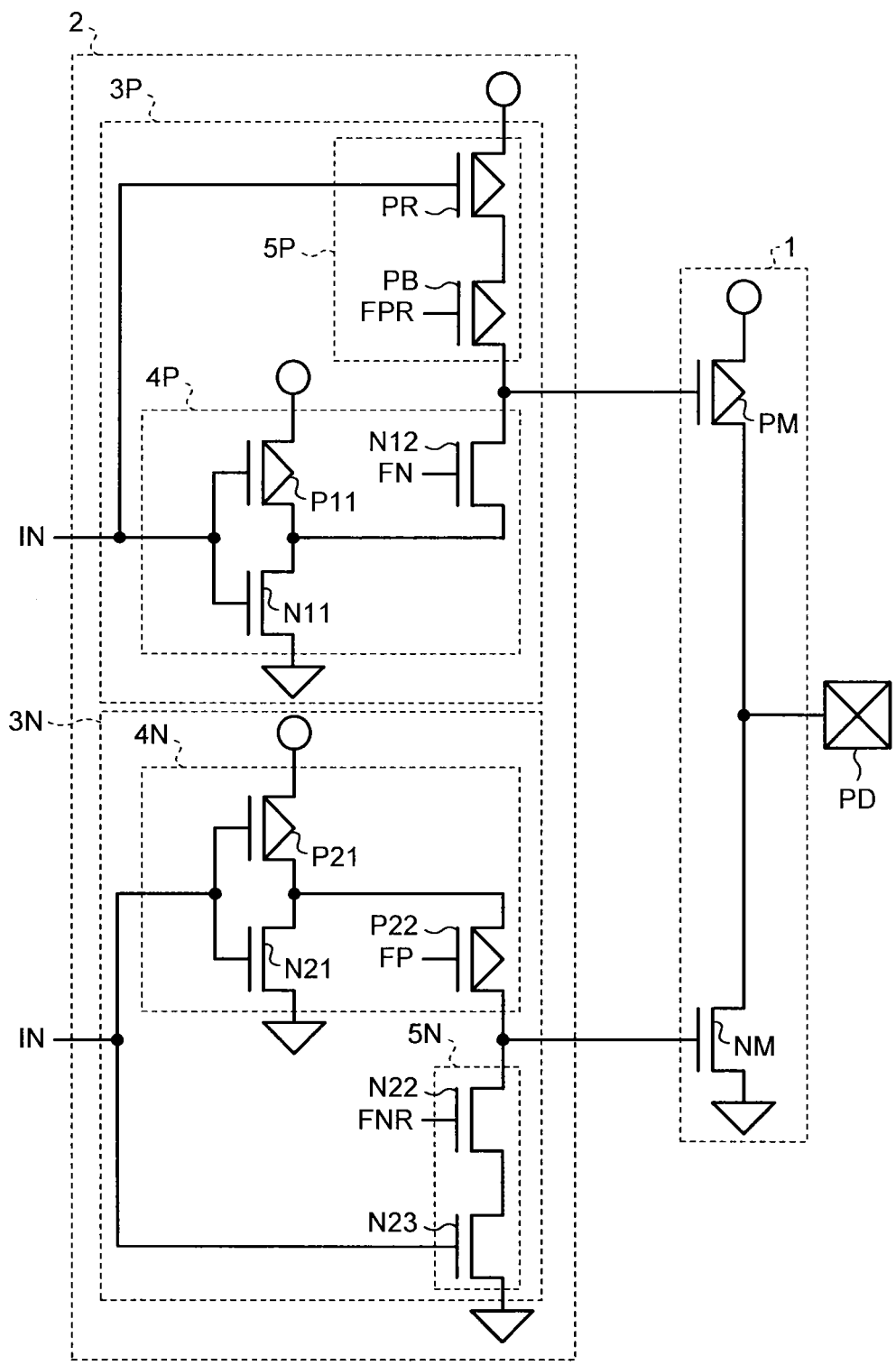
FIG. 1 is a block diagram schematically illustrating the configuration of an interface circuit according to a first embodiment.

FIG. 1 is a block diagram schematically illustrating the configuration of an interface circuit according to a first embodiment.

In FIG. 1, the interface circuit is provided with an output buffer 1 which generates an output waveform and a driver circuit 2 which drives the output buffer 1. The output buffer 1 is provided with a P-channel field-effect transistor PM and an N-channel field-effect transistor NM. Here, the P-channel field-effect transistor PM and the N-channel field-effect transistor NM are connected to each other in series, and a drain terminal of the P-channel field-effect transistor PM and a drain terminal of the N-channel field-effect transistor NM are connected to a pad electrode PD. The size of the P-channel field-effect transistor PM can be increased more than that of the N-channel field-effect transistor NM.

The driver circuit 2 is provided with a P-driver circuit 3P which drives the P-channel field-effect transistor PM and an N-driver circuit 3N which drives the N-channel field-effect transistor NM. The P-driver circuit 3P is provided with a P-slew rate control unit 4P and a P-reset rate control unit 5P, and the N-driver circuit 3N is provided with an N-slew rate control unit 4N and an N-reset rate control unit 5N.

The P-slew rate control unit 4P can turn on the P-channel field-effect transistor PM by pulling down a gate potential of the P-channel field-effect transistor PM on the basis of an input voltage IN. In addition, the P-slew rate control unit 4P can change a turn-ON speed of the P-channel field-effect transistor PM on the basis of an intermediate voltage FN.

Here, the P-slew rate control unit 4P is provided with a P-channel field-effect transistor P11 and N-channel field-effect transistors N11 and N12. The P-channel field-effect transistor P11 and the N-channel field-effect transistor N11 are connected to each other in series. In addition, a drain terminal of the P-channel field-effect transistor P11 and a drain terminal of the N-channel field-effect transistor N11 are connected to a gate terminal of the P-channel field-effect transistor PM through the N-channel field-effect transistor N12. An input voltage IN is applied to a gate terminal of the P-channel field-effect transistor P11 and a gate terminal of the N-channel field-effect transistor N11, and an intermediate voltage FN is applied to a gate terminal of the N-channel field-effect transistor N12. The intermediate voltage FN can be set so that the N-channel field-effect transistor N12 acts as a resistance.

The P-reset rate control unit 5P can turn off the P-channel field-effect transistor PM by pulling up a gate potential of the P-channel field-effect transistor PM on the basis of an input voltage IN. In addition, the P-reset rate control unit 5P can change a turn-OFF speed of the P-channel field-effect transistor PM on the basis of an intermediate voltage FPR.

Here, the P-reset rate control unit 5P is provided with P-channel field-effect transistors P12 and P13. The P-channel field-effect transistors P12 and P13 are connected to each other in series. In addition, a drain terminal of the P-channel field-effect transistor P13 is connected to the gate terminal of the P-channel field-effect transistor PM. An input voltage IN is applied to a gate terminal of the P-channel field-effect transistor P12, and an intermediate voltage FPR is applied to a gate terminal of the P-channel field-effect transistor P13. The intermediate voltage FPR can be set so that the P-channel field-effect transistor P13 acts as a resistance.

The N-slew rate control unit 4N can turn on the N-channel field-effect transistor NM by pulling up a gate potential of the N-channel field-effect transistor NM on the basis of an input voltage IN. In addition, the N-slew rate control unit 4N can change a turn-ON speed of the N-channel field-effect transistor NM on the basis of an intermediate voltage FP.

Here, the N-slew rate control unit 4N is provided with P-channel field-effect transistors P21 and P22 and an N-channel field-effect transistor N21. The P-channel field-effect transistor P21 and the N-channel field-effect transistor N21 are connected to each other in series. In addition, a drain terminal of the P-channel field-effect transistor P21 and a drain terminal of the N-channel field-effect transistor N21 are connected to a gate terminal of the N-channel field-effect transistor NM through the P-channel field-effect transistor P22. An input voltage IN is applied to a gate terminal of the P-channel field-effect transistor P21 and a gate terminal of the N-channel field-effect transistor N21, and an intermediate voltage FP is applied to a gate terminal of the P-channel field-effect transistor P22. The intermediate voltage FP can be set so that the P-channel field-effect transistor P22 acts as a resistance.

The N-reset rate control unit 5N can turn off the N-channel field-effect transistor NM by pulling down a gate potential of the N-channel field-effect transistor NM on the basis of an input voltage IN. In addition, the N-reset rate control unit 5N can change a turn-OFF speed of the N-channel field-effect transistor NM on the basis of an intermediate voltage FNR.

Here, the N-reset rate control unit 5N is provided with N-channel field-effect transistors N22 and N23. The N-channel field-effect transistors N22 and N23 are connected to each other in series. In addition, a drain terminal of the N-channel field-effect transistor N22 is connected to the gate terminal of the N-channel field-effect transistor NM. An input voltage IN is applied to a gate terminal of the N-channel field-effect transistor N23, and an intermediate voltage FNR is applied to a gate terminal of the N-channel field-effect transistor N22. The intermediate voltage FNR can be set so that the N-channel field-effect transistor N22 acts as a resistance.

In the P-driver circuit 3P, when an input voltage IN rises, the P-channel field-effect transistors P11 and P12 are turned off, and the N-channel field-effect transistor N11 is turned on. Therefore, the gate potential of the P-channel field-effect transistor PM is pulled down through the N-channel field-effect transistors N11 and N12, and the P-channel field-effect transistor PM is turned on. At this time, the gradient of the fall-off of the gate potential of the P-channel field-effect transistor PM is adjusted through the N-channel field-effect transistor N12, and the turn-ON speed of the P-channel field-effect transistor PM is adjusted.

In addition, in the N-driver circuit 3N, when an input voltage IN rises, the P-channel field-effect transistor P21 is turned off, and the N-channel field-effect transistors N21 and N23 are turned on. Therefore, the gate potential of the N-channel field-effect transistor NM is pulled down through the N-channel field-effect transistors N22 and N23, and the N-channel field-effect transistor NM is turned off. At this time, the gradient of the fall-off of the gate potential of the N-channel field-effect transistor NM is adjusted through the N-channel field-effect transistor N22, and the turn-OFF speed of the N-channel field-effect transistor NM is adjusted.

On the other hand, in the P-driver circuit 3P, when an input voltage IN falls, the P-channel field-effect transistors P11 and P12 are turned on, and the N-channel field-effect transistor N11 is turned off. Therefore, the gate potential of the P-channel field-effect transistor PM is pulled up through the P-channel field-effect transistors P12 and P13, and the P-channel field-effect transistor PM is turned off. At this time, the gradient of the fall-off of the gate potential of the P-channel field-effect transistor PM is adjusted through the P-channel field-effect transistor P13, and the turn-OFF speed of the P-channel field-effect transistor PM is adjusted.

In addition, in the N-driver circuit 3N, when an input voltage IN falls, the P-channel field-effect transistor P21 is turned on and the N-channel field-effect transistors N21 and N23 are turned off. Therefore, the gate potential of the N-channel field-effect transistor NM is pulled up through the P-channel field-effect transistor P21, and the N-channel field-effect transistor NM is turned on. At this time, the gradient of the rise of the gate potential of the N-channel field-effect transistor NM is adjusted through the P-channel field-effect transistor P22, and the turn-ON speed of the N-channel field-effect transistor NM is adjusted.

Here, by providing the P-slew rate control unit 4P and the N-slew rate control unit 4N, the turn-ON speeds of the P-channel field-effect transistor PM and the N-channel field-effect transistor NM can be adjusted, and by providing the P-reset rate control unit 5P and the N-reset rate control unit 5N, the turn-OFF speeds of the P-channel field-effect transistor PM and the N-channel field-effect transistor NM can be adjusted. Therefore, the P-channel field-effect transistor PM and the N-channel field-effect transistor NM can be turned on/off gradually, and an immediate change in the current flowing to the pad electrode PD can be suppressed. As a result, even when external wiring connected to the pad electrode PD contains an inductance component, noise caused in the output waveform can be reduced.

Figure 2A:
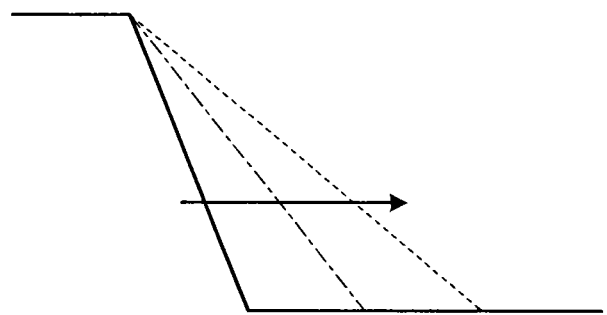
FIGS. 2A to 2C are diagrams illustrating a waveform when changing the reset rate of a driver output of the interface circuit of FIG. 1.
Figure 2B:
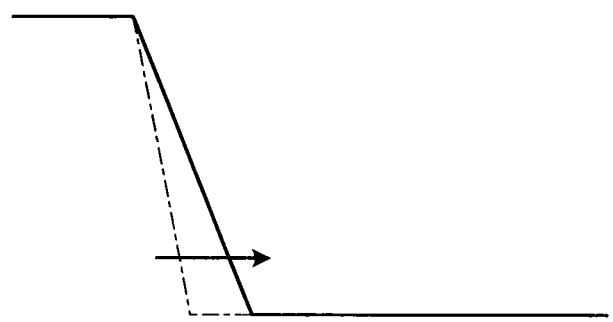
Figure 2C:
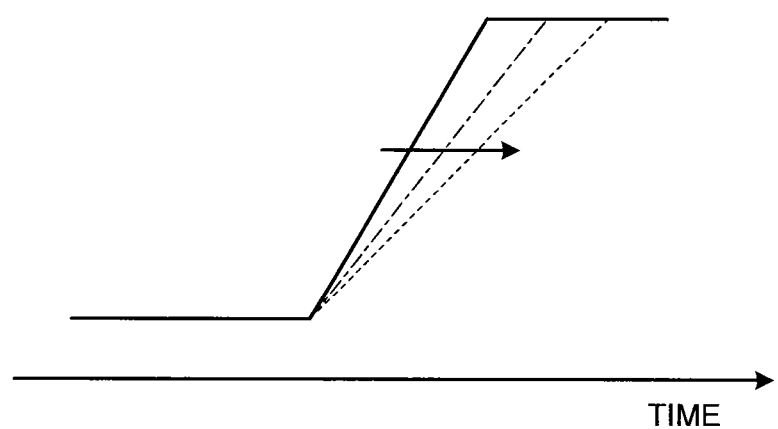

FIGS. 2A to 2C are diagrams illustrating a waveform when changing the reset rate of a driver output of the interface circuit of FIG. 1.

In FIG. 2A, when the intermediate voltage FN of FIG. 1 is reduced, the gradient of the fall-off of the gate potential of the P-channel field-effect transistor PM becomes gentle. Therefore, as illustrated in FIG. 2C, the gradient of the rise of the output waveform of the pad electrode PD becomes gentle. At this time, in order to reduce OFF-noise when the N-channel field-effect transistor NM is turned off, when the intermediate voltage FNR of FIG. 1 is reduced, the gradient of the fall-off of the gate potential of the N-channel field-effect transistor NM becomes gentle as illustrated in FIG. 2.

Here, when the gradient of the fall-off of the gate potential of the N-channel field-effect transistor NM becomes gentle, the P-channel field-effect transistor PM is turned on while the N-channel field-effect transistor NM is not turned off, and this leads to an increase in the through current. Therefore, a time lag may be provided between an input voltage IN which is input to the P-driver circuit 3P and an input voltage IN which is input to the N-driver circuit 3N so that the P-channel field-effect transistor PM and the N-channel field-effect transistor NM are not turned on at the same time.

Figure 3:
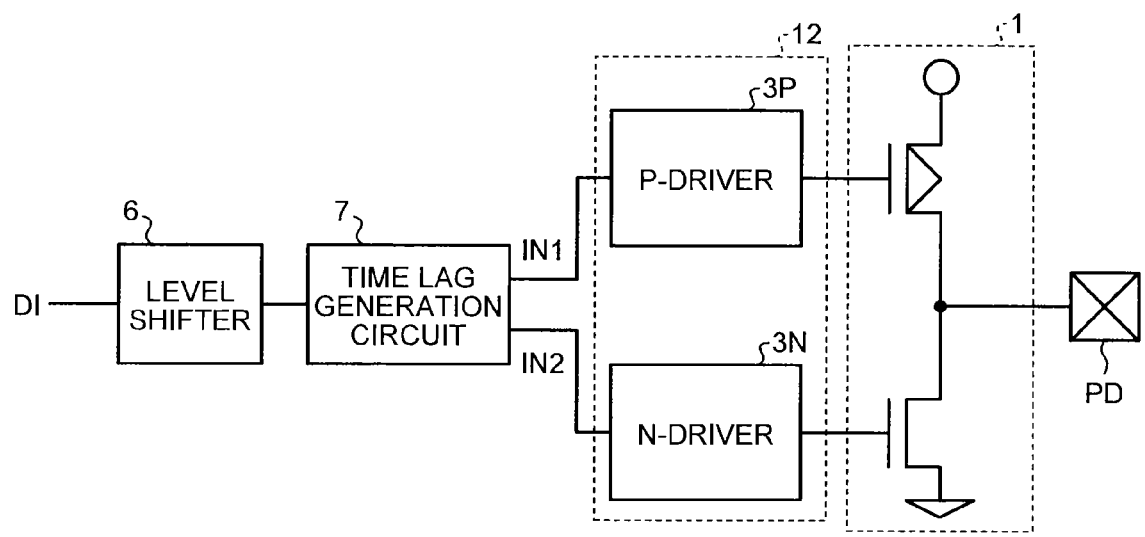
FIG. 3 is a block diagram illustrating a configuration in which the interface circuit of FIG. 1 has a time lag generation circuit attached thereto.

FIG. 3 is a block diagram illustrating a configuration in which the interface circuit of FIG. 1 has a time lag generation circuit attached thereto.

In FIG. 3, a time lag generation circuit 7 is connected to the front stage of the interface circuit of FIG. 1, and a level shifter 6 is connected to the front stage of the time lag generation circuit 7. An input signal DI is level-shifted by the level shifter 6, and is then input to the time lag generation circuit 7. In the time lag generation circuit 7, input voltages IN1 and IN2 are generated and output to the P-driver circuit 3P and the N-driver circuit 3N, respectively, to add a period of time in order to turn off both of the P-channel field-effect transistor PM and the N-channel field-effect transistor NM at the same time in accordance with the input signal DI.

Figure 4:
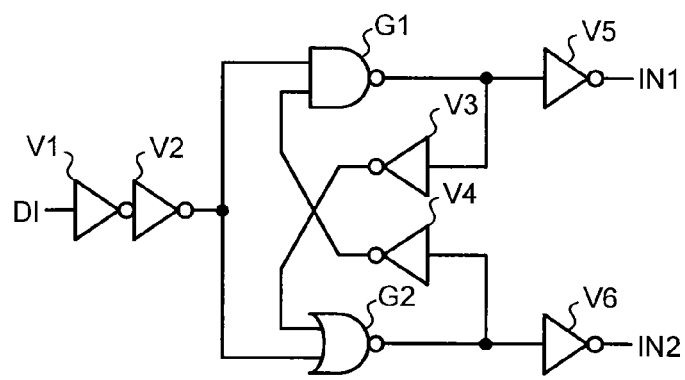
FIG. 4 is a circuit diagram illustrating an example of the configuration of the time lag generation circuit of FIG. 3.

FIG. 4 is a circuit diagram illustrating an example of the configuration of the time lag generation circuit of FIG. 3.

In FIG. 4, the time lag generation circuit 7 is provided with a NAND circuit G1, a NOR circuit G2, and inverters V1 to V6. An input signal DI sequentially passes through the inverters V1 and V2, and is input to the NAND circuit G1 and the NOR circuit G2. In addition, an output of the NAND circuit G1 is input to the NOR circuit G2 through the inverter V3. In addition, an output of the NOR circuit G2 is input to the NAND circuit G1 through the inverter V4.

In the NAND circuit G1, NAND operation of the output of the inverter V2 and the output of the inverter V4 is performed, and the result thereof is output to the P-driver circuit 3P through the inverter V5. In addition, in the NOR circuit G2, NOR operation of the output of the inverter V2 and the output of the inverter V3 is performed, and the result thereof is output to the N-driver circuit 3N through the inverter V6.

Second Embodiment

Figure 5:
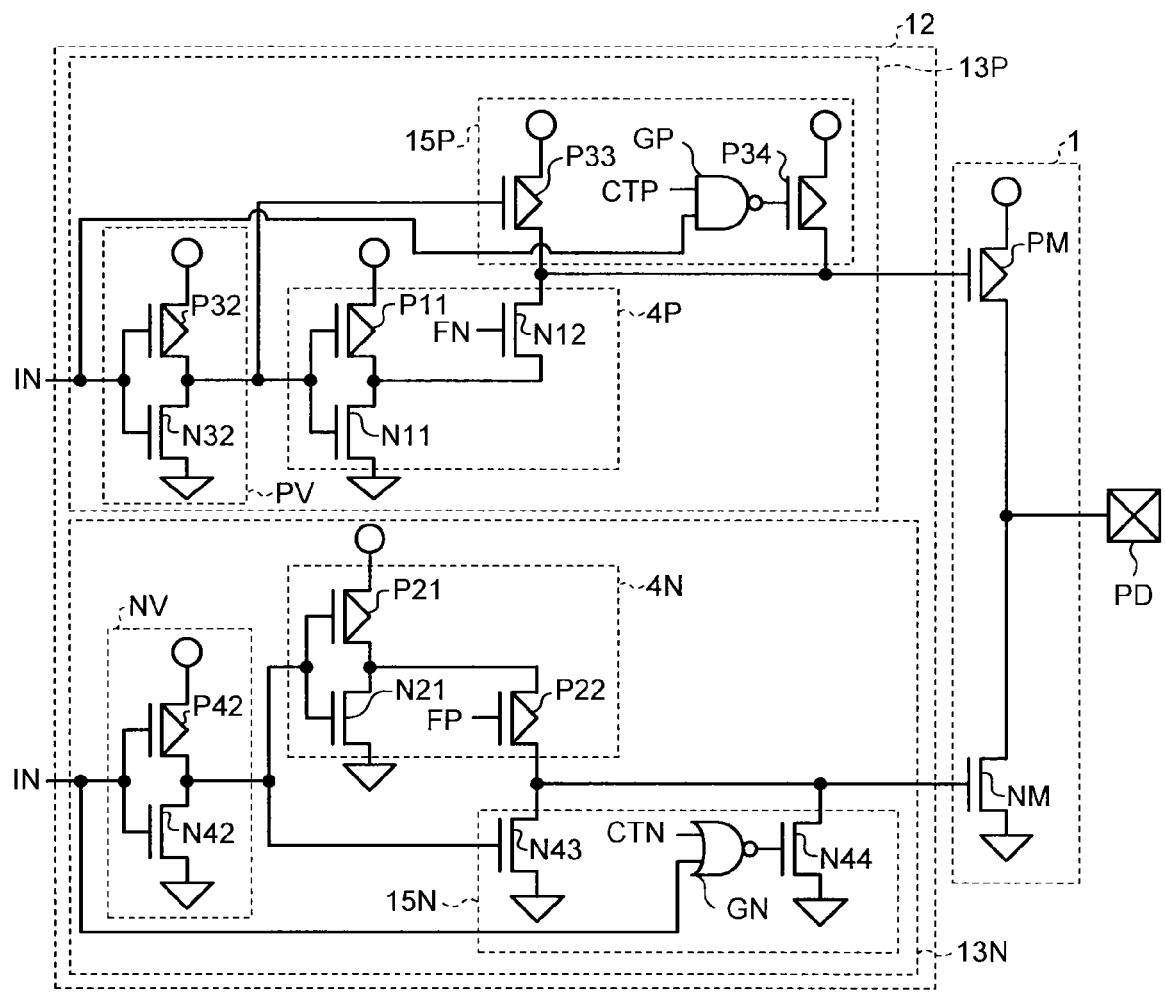
FIG. 5 is a block diagram schematically illustrating the configuration of an interface circuit according to a second embodiment.

FIG. 5 is a block diagram schematically illustrating the configuration of an interface circuit according to a second embodiment.

In FIG. 5, in this interface circuit, a driver circuit 12 is provided in place of the driver circuit 2 of FIG. 1.

The driver circuit 12 is provided with a P-driver circuit 13P which drives a P-channel field-effect transistor PM and an N-driver circuit 13N which drives an N-channel field-effect transistor NM. The P-driver circuit 13P is provided with a P-slew rate control unit 4P, a P-reset rate control unit 15P, and an inverter PV, and the N-driver circuit 13N is provided with an N-slew rate control unit 4N, an N-reset rate control unit 15N, and an inverter NV.

The P-reset rate control unit 15P can turn off the P-channel field-effect transistor PM by pulling up a gate potential of the P-channel field-effect transistor PM on the basis of an input voltage IN. In addition, the P-reset rate control unit 15P can change a turn-OFF speed of the P-channel field-effect transistor PM on the basis of a selection signal CTP.

Here, the P-reset rate control unit 15P is provided with P-channel field-effect transistors P33 and P34 and a NAND circuit GP. The P-channel field-effect transistors P33 and P34 are connected to each other in parallel. In addition, drain terminals of the P-channel field-effect transistors P33 and P34 are connected to a gate terminal of the P-channel field-effect transistor PM. An input voltage IN is applied to a gate terminal of the P-channel field-effect transistor P33 through the inverter PV, and an output of the NAND circuit GP is applied to a gate terminal of the P-channel field-effect transistor P34. An input voltage IN and a selection signal CTP are input to the NAND circuit GP.

The selection signal CTP can be made active on the basis of a power-supply voltage and an operation speed of the driver circuit 12. For example, when a power-supply voltage of the driver circuit 12 corresponds to two power supplies of 1.8 V and 3.3 V, in the case of the 1.8-V power supply, the selection signal CTP is made active, and thus the gate potential of the P-channel field-effect transistor PM can be pulled up by the P-channel field-effect transistors P33 and P34, and in the case of the 3.3-V power supply, the selection signal CTP is made inactive, and thus the gate potential of the P-channel field-effect transistor PM can be pulled up by the P-channel field effect transistor P33.

The inverter PV is provided with a P-channel field-effect transistor P32 and an N-channel field-effect transistor N32. Here, the P-channel field-effect transistor P32 and the N-channel field-effect transistor N32 are connected to each other in series, and a drain terminal of the P-channel field-effect transistor P32 and a drain terminal of the N-channel field-effect transistor N32 are connected to gate terminals of the P-channel field-effect transistors P11 and P33 and a gate terminal of the N-channel field-effect transistor N11. An input voltage IN is applied to a gate terminal of the P-channel field-effect transistor P32 and a gate terminal of the N-channel field-effect transistor N32.

The N-reset rate control unit 15N can turn off the N-channel field-effect transistor NM by pulling down a gate potential of the N-channel field-effect transistor NM on the basis of an input voltage IN. In addition, the N-reset rate control unit 15N can change a turn-OFF speed of the N-channel field-effect transistor NM on the basis of a selection signal CTN.

Here, the N-reset rate control unit 15N is provided with N-channel field-effect transistors N43 and N44 and a NOR circuit GN. The N-channel field-effect transistors N43 and N44 are connected to each other in parallel. In addition, drain terminals of the N-channel field-effect transistors N43 and N44 are connected to a gate terminal of the N-channel field-effect transistor NM. An input voltage IN is applied to a gate terminal of the N-channel field-effect transistor N43 through the inverter NV, and an output of the NOR circuit GN is applied to a gate terminal of the N-channel field-effect transistor N44. An input voltage IN and a selection signal CTN are input to the NOR circuit GN.

The selection signal CTN can be made active on the basis of a power-supply voltage and an operation speed of the driver circuit 12. For example, when a power-supply voltage of the driver circuit 12 corresponds to two power supplies of 1.8 V and 3.3 V, in the case of the 1.8-V power supply, the selection signal CTN is made active, and thus the gate potential of the N-channel field-effect transistor NM can be pulled down by the N-channel field-effect transistors N43 and N44, and in the case of the 3.3-V power supply, the selection signal CTN is made inactive, and thus the gate potential of the N-channel field-effect transistor NM can be pulled down by the N-channel field effect transistor N43.

The inverter NV is provided with a P-channel field-effect transistor P42 and an N-channel field-effect transistor N42. Here, the P-channel field-effect transistor P42 and the N-channel field-effect transistor N42 are connected to each other in series, and a drain terminal of the P-channel field-effect transistor P42 and a drain terminal of the N-channel field-effect transistor N42 are connected to a gate terminal of the P-channel field-effect transistor P21 and gate terminals of the N-channel field-effect transistors N21 and N43. An input voltage IN is applied to a gate terminal of the P-channel field-effect transistor P42 and a gate terminal of the N-channel field-effect transistor N42.

In the P-driver circuit 13P, when an input voltage IN falls, the P-channel field-effect transistors P11 and P33 are turned off and the N-channel field-effect transistor N11 is turned on. Therefore, the gate potential of the P-channel field-effect transistor PM is pulled down through the N-channel field-effect transistors N11 and N12, and the P-channel field-effect transistor PM is turned on. At this time, the gradient of the fall-off of the gate potential of the P-channel field-effect transistor PM is adjusted through the N-channel field-effect transistor N12, and the turn-ON speed of the P-channel field-effect transistor PM is adjusted.

In addition, in the N-driver circuit 13N, when an input voltage IN falls, the P-channel field-effect transistor P21 is turned off and the N-channel field-effect transistors N21 and N43 are turned on. Therefore, the gate potential of the N-channel field-effect transistor NM is pulled down through the N-channel field-effect transistor N43, and the N-channel field-effect transistor NM is turned off. At this time, the N-channel field-effect transistor N44 is turned on in response to a selection signal CTN. Therefore, the gradient of the fall-off of the gate potential of the N-channel field-effect transistor NM is adjusted through the N-channel field-effect transistor N44 in response to the selection signal CTN, and the turn-OFF speed of the N-channel field-effect transistor NM is adjusted.

Here, in order to adjust the turn-OFF speed of the N-channel field-effect transistor NM, the number of the N-channel field-effect transistors N43 and N44 which pull down the gate potential of the N-channel field-effect transistor NM is changed, and thus it is possible to prevent an excessive load from being applied in series to the N-channel field-effect transistors N43 and N44, and it is possible to suppress an increase in the sizes of the N-channel field-effect transistors N43 and N44.

On the other hand, in the P-driver circuit 13P, when an input voltage IN rises, the P-channel field-effect transistors P11 and P33 are turned on, and the N-channel field-effect transistor N11 is turned off. Therefore, the gate potential of the P-channel field-effect transistor PM is pulled up through the P-channel field-effect transistor P33, and the P-channel field-effect transistor PM is turned off. At this time, the P-channel field-effect transistor P34 is turned on in response to a selection signal CTP. Therefore, the gradient of the rise of the gate potential of the P-channel field-effect transistor PM is adjusted through the P-channel field-effect transistor P34 in response to the selection signal CTP, and the turn-OFF speed of the P-channel field-effect transistor PM is adjusted.

Here, in order to adjust the turn-OFF speed of the P-channel field-effect transistor PM, the number of the P-channel field-effect transistors P33 and P34 which pull up the gate potential of the P-channel field-effect transistor PM is changed, and thus it is possible to prevent an excessive load from being applied in series to the P-channel field-effect transistors P33 and P34, and it is possible to suppress an increase in the sizes of the P-channel field-effect transistors P33 and P34.

In addition, in the N-driver circuit 13N, when an input voltage IN rises, the P-channel field-effect transistor P21 is turned on, and the N-channel field-effect transistors N21 and N43 are turned off. Therefore, the gate potential of the N-channel field-effect transistor NM is pulled up through the P-channel field-effect transistors P21 and P22, and the N-channel field-effect transistor NM is turned on. At this time, the gradient of the rise of the gate potential of the N-channel field-effect transistor NM is adjusted through the P-channel field-effect transistor P22, and the turn-ON speed of the N-channel field-effect transistor NM is adjusted.

Third Embodiment

Figure 6:
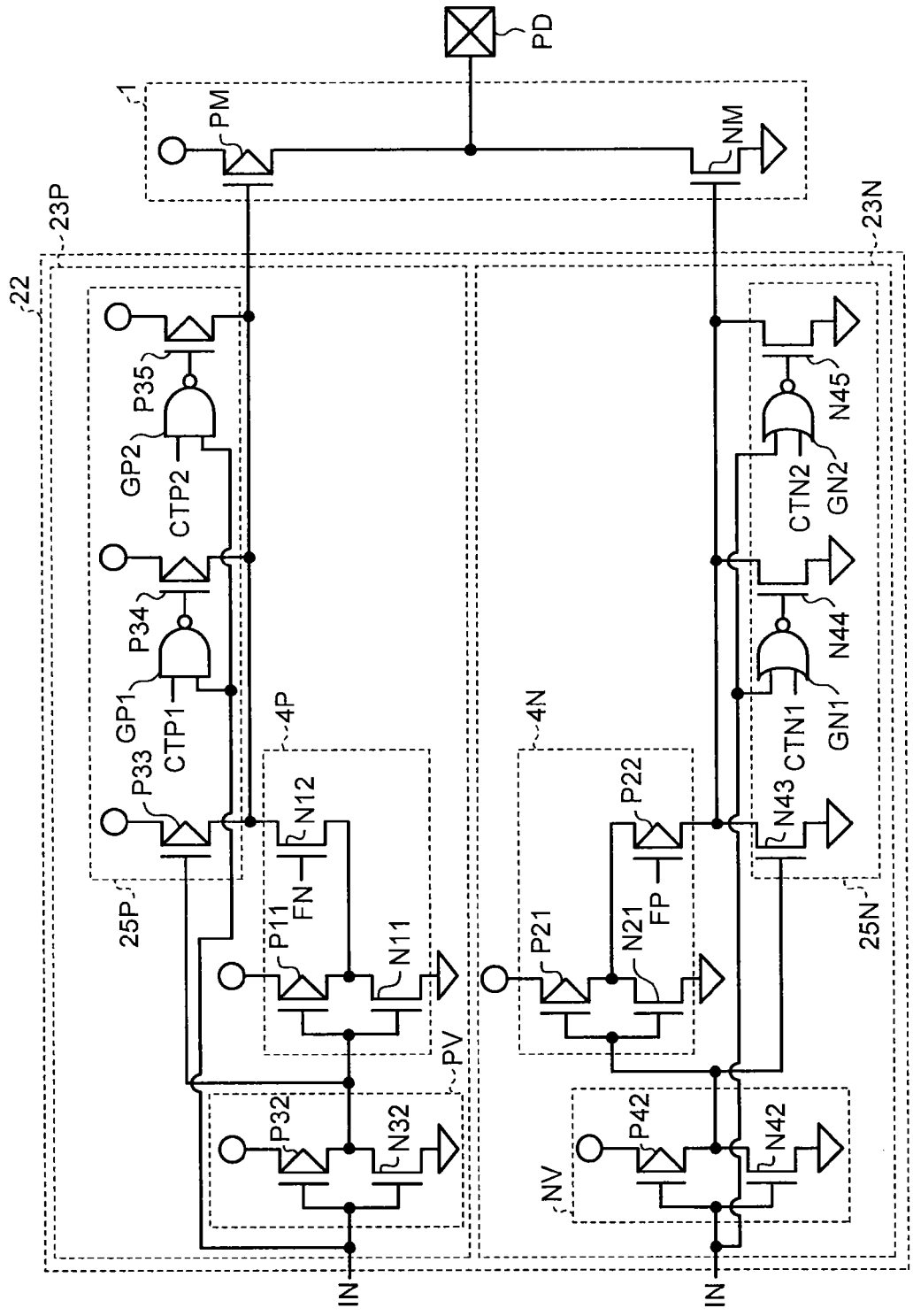
FIG. 6 is a block diagram schematically illustrating the configuration of an interface circuit according to a third embodiment.

FIG. 6 is a block diagram schematically illustrating the configuration of an interface circuit according to a third embodiment.

In FIG. 6, in this interface circuit, a driver circuit 22 is provided in place of the driver circuit 12 of FIG. 5.

The driver circuit 22 is provided with a P-driver circuit 23P which drives a P-channel field-effect transistor PM and an N-driver circuit 23N which drives an N-channel field-effect transistor NM. In the P-driver circuit 23P, a P-reset rate control unit 25P is provided in place of the P-reset rate control unit 15P. In the N-driver circuit 23N, an N-reset rate control unit 25N is provided in place of the N-reset rate control unit 15N.

The P-reset rate control unit 25P can turn off the P-channel field-effect transistor PM by pulling up a gate potential of the P-channel field-effect transistor PM on the basis of an input voltage IN. In addition, the P-reset rate control unit 25P can change a turn-OFF speed of the P-channel field-effect transistor PM on the basis of selection signals CTP1 and CTP2.

Here, the P-reset rate control unit 25P is provided with P-channel field-effect transistors P33 to P35 and NAND circuits GP1 and GP2. The P-channel field-effect transistors P33 to P35 are connected to each other in parallel. In addition, drain terminals of the P-channel field-effect transistors P33 to P35 are connected to a gate terminal of the P-channel field-effect transistor PM. An input voltage IN is applied to a gate terminal of the P-channel field-effect transistor P33 through an inverter PV, an output of the NAND circuit GP1 is applied to a gate terminal of the P-channel field-effect transistor P34, and an output of the NAND circuit GP2 is applied to a gate terminal of the P-channel field-effect transistor P35. An input voltage IN and a selection signal CTP1 are input to the NAND circuit GP1, and an input voltage IN and a selection signal CTP2 are input to the NAND circuit GP2. Selection signals CTP1 and CTP2 can be made active on the basis of a power-supply voltage and an operation speed of the driver circuit 22. The values of the power-supply voltage and the operation speed are memorized in registers.

The N-reset rate control unit 25N can turn off the N-channel field-effect transistor NM by pulling down a gate potential of the N-channel field-effect transistor NM on the basis of an input voltage IN. In addition, the N-reset rate control unit 25N can change a turn-OFF speed of the N-channel field-effect transistor NM on the basis of selection signals CTN1 and CTN2.

Here, the N-reset rate control unit 25N is provided with N-channel field-effect transistors N43 to N45 and NOR circuits GN1 and GN2. The N-channel field-effect transistors N43 to N45 are connected to each other in parallel. In addition, drain terminals of the N-channel field-effect transistors N43 to N45 are connected to a gate terminal of the N-channel field-effect transistor NM. An input voltage IN is applied to a gate terminal of the N-channel field-effect transistor N43 through an inverter NV, an output of the NOR circuit GN1 is applied to a gate terminal of the N-channel field-effect transistor N44, and an output of the NOR circuit GN2 is applied to a gate terminal of the N-channel field-effect transistor N45. An input voltage IN and a selection signal CTN1 are input to the NOR circuit GN1, and an input voltage IN and a selection signal CTN2 are input to the NOR circuit GN2. Selection signals CTN1 and CTN2 can be made active on the basis of a power-supply voltage and an operation speed of the driver circuit 22. The values of the power-supply voltage and the operation speed are memorized in registers.

In the N-driver circuit 23N, when an input voltage IN falls, a P-channel field-effect transistor P21 is turned off and the N-channel field-effect transistors N21 and N43 are turned on. Therefore, the gate potential of the N-channel field-effect transistor NM is pulled down through the N-channel field-effect transistor N43, and the N-channel field-effect transistor NM is turned off. At this time, the N-channel field-effect transistors N44 and N45 are turned on in response to selection signals CTN1 and CTN2, respectively. Therefore, the gradient of the fall-off of the gate potential of the N-channel field-effect transistor NM is adjusted through the N-channel field-effect transistors N44 and N45 in response to the respective selection signals CTN1 and CTN2, and the turn-OFF speed of the N-channel field-effect transistor NM is adjusted.

Here, by increasing the number of the N-channel field-effect transistors N43 to N45 which can be used in pulling down the gate potential of the N-channel field-effect transistor NM, the sizes of the N-channel field-effect transistors N43 to N45 can be suppressed from being increased, and the turn-OFF speed of the N-channel field-effect transistor NM can be precisely adjusted.

In the above-described embodiment, although the method has been described in which the number of the N-channel field-effect transistors N43 to N45 which can be used in pulling down the gate potential of the N-channel field-effect transistor NM is set to three, the above number may be set to four or greater.

On the other hand, in the P-driver circuit 23P, when an input voltage IN rises, the P-channel field-effect transistors P11 and P33 are turned on, and the N-channel field-effect transistor N11 is turned off. Therefore, the gate potential of the P-channel field-effect transistor PM is pulled up through the P-channel field-effect transistor P33, and the P-channel field-effect transistor PM is turned off. At this time, the P-channel field-effect transistors P34 and P35 are turned on in response to selection signals CTP1 and CTP2, respectively. Therefore, the gradient of the rise of the gate potential of the P-channel field-effect transistor PM is adjusted through the P-channel field-effect transistor P34 in response to the respective selection signals CTP1 and CTP2, and the turn-OFF speed of the P-channel field-effect transistor PM is adjusted.

Here, by increasing the number of the P-channel field-effect transistors P33 to P35 which can be used in pulling up the gate potential of the P-channel field-effect transistor PM, the sizes of the P-channel field-effect transistors P33 to P35 can be suppressed from being increased, and the turn-OFF speed of the P-channel field-effect transistor PM can be precisely adjusted.

In the above-described embodiment, although the method has been described in which the number of the P-channel field-effect transistors P33 to P35 which can be used in pulling up the gate potential of the P-channel field-effect transistor PM is set to three, the above number may be set to four or greater.

Fourth Embodiment

Figure 7:
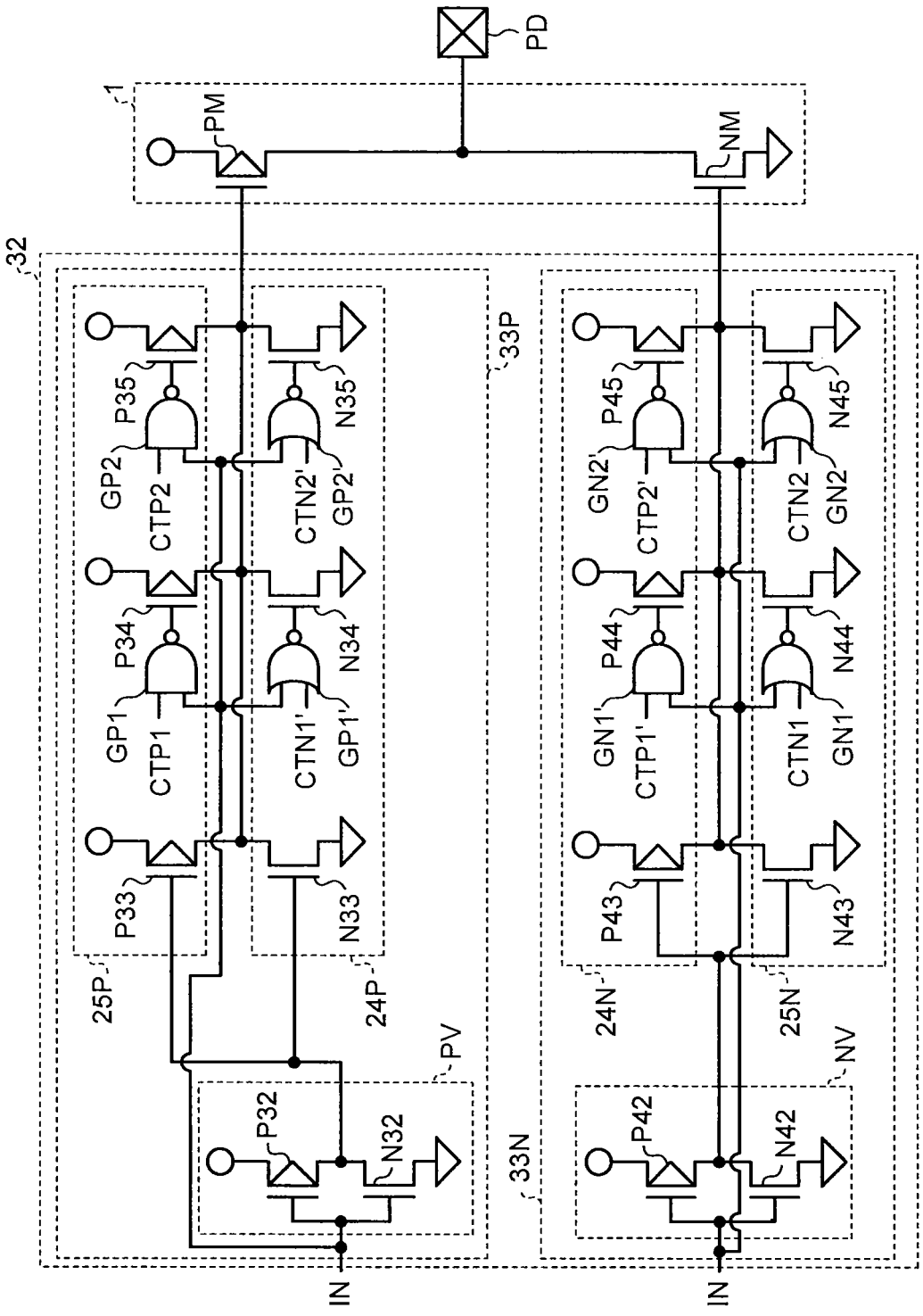
FIG. 7 is a block diagram schematically illustrating the configuration of an interface circuit according to a fourth embodiment.

FIG. 7 is a block diagram schematically illustrating the configuration of an interface circuit according to a fourth embodiment.

In FIG. 7, in this interface circuit, a driver circuit 32 is provided in place of the driver circuit 22 of FIG. 6.

The driver circuit 32 is provided with a P-driver circuit 33P which drives a P-channel field-effect transistor PM and an N-driver circuit 33N which drives an N-channel field-effect transistor NM. In the P-driver circuit 33P, a P-slew rate control unit 24P is provided in place of the P-slew rate control unit 4P of FIG. 6. In the N-driver circuit 33N, an N-slew rate control unit 24N is provided in place of the N-slew rate control unit 4N of FIG. 6.

The P-slew rate control unit 24P can turn on the P-channel field-effect transistor PM by pulling down a gate potential of the P-channel field-effect transistor PM on the basis of an input voltage IN. In addition, the P-slew rate control unit 24P can change a turn-ON speed of the P-channel field-effect transistor PM on the basis of selection signals CTN1' and CTN2'.

Here, the P-slew rate control unit 24P is provided with N-channel field-effect transistors N33 to N35 and NOR circuits GP1' and GP2'. The N-channel field-effect transistors N33 to N35 are connected to each other in parallel. In addition, drain terminals of the N-channel field-effect transistors N33 to N35 are connected to a gate terminal of the P-channel field-effect transistor PM. An input voltage IN is applied to a gate terminal of the N-channel field-effect transistor N33 through an inverter PV, an output of the NOR circuit GP1' is applied to a gate terminal of the N-channel field-effect transistor N34, and an output of the NOR circuit GP2' is applied to a gate terminal of the N-channel field-effect transistor N35. An input voltage IN and a selection signal CTN1' are input to the NOR circuit GP1', and an input voltage IN and a selection signal CTN2' are input to the NOR circuit GP2'. Selection signals CTN1' and CTN2' can be made active on the basis of a power-supply voltage and an operation speed of the driver circuit 32. The values of the power-supply voltage and the operation speed are memorized in registers.

The N-slew rate control unit 24N can turn on the N-channel field-effect transistor NM by pulling up a gate potential of the N-channel field-effect transistor NM on the basis of an input voltage IN. In addition, the N-slew rate control unit 24N can change a turn-ON speed of the N-channel field-effect transistor NM on the basis of selection signals CTP1' and CTP2'.

Here, the N-slew rate control unit 24N is provided with P-channel field-effect transistors P43 to P45 and NAND circuits GN1' and GN2'. The P-channel field-effect transistors P43 to P45 are connected to each other in parallel. In addition, drain terminals of the P-channel field-effect transistors P43 to P45 are connected to the gate terminal of the P-channel field-effect transistor PM. An input voltage IN is applied to a gate terminal of the P-channel field-effect transistor P43 through an inverter NV, an output of the NAND circuit GN1' is applied to a gate terminal of the P-channel field-effect transistor P44, and an output of the NAND circuit GN2' is applied to a gate terminal of the P-channel field-effect transistor P45. An input voltage IN and a selection signal CTP1' are input to the NAND circuit GN1', and an input voltage IN and a selection signal CTP2' are input to the NAND circuit GN2'. Selection signals CTP1' and CTP2' can be made active on the basis of a power-supply voltage and an operation speed of the driver circuit 32. The values of the power-supply voltage and the operation speed are memorized in registers.

In the P-driver circuit 33P, when an input voltage IN falls, a P-channel field-effect transistor P33 is turned off, and the N-channel field-effect transistor N33 is turned on. Therefore, the gate potential of the P-channel field-effect transistor PM is pulled down through the N-channel field-effect transistor N33, and the P-channel field-effect transistor PM is turned on. At this time, the N-channel field-effect transistors N34 and N35 are turned on in response to selection signals CTN1' and CTN2', respectively. Therefore, the gradient of the fall-off of the gate potential of the P-channel field-effect transistor PM is adjusted through the N-channel field-effect transistors N34 and N35 in response to the respective selection signals CTN1' and CTN2', and the turn-ON speed of the P-channel field-effect transistor PM is adjusted.

Here, in order to adjust the turn-ON speed of the P-channel field-effect transistor PM, the number of the N-channel field-effect transistors N33 to N35 which pull down the gate potential of the N-channel field-effect transistor NM is changed, and thus it is possible to prevent an excessive load from being applied in series to the N-channel field-effect transistors N33 to N35, and it is possible to suppress an increase in the sizes of the N-channel field-effect transistors N33 to N35.

In the above-described embodiment, although the method has been described in which the number of the N-channel field-effect transistors N33 to N35 which can be used in pulling down the gate potential of the N-channel field-effect transistor NM is set to three, the above number may be set to four or greater.

On the other hand, in the N-driver circuit 33N, when an input voltage IN rises, the P-channel field-effect transistor P43 is turned on, and the N-channel field-effect transistor N43 is turned off. Therefore, the gate potential of the N-channel field-effect transistor NM is pulled up through the P-channel field-effect transistor P43, and the N-channel field-effect transistor NM is turned on. At this time, the P-channel field-effect transistors P44 and P45 are turned on in response to selection signals CTP1' and CTP2', respectively. Therefore, the gradient of the rise of the gate potential of the N-channel field-effect transistor NM is adjusted through the P-channel field-effect transistors P44 and P45 in response to the respective selection signals CTP1' and CTP2', and the turn-ON speed of the N-channel field-effect transistor NM is adjusted.

Here, in order to adjust the turn-ON speed of the N-channel field-effect transistor NM, the number of the N-channel field-effect transistors N43 to N45 which pull up the gate potential of the N-channel field-effect transistor NM is changed, and thus it is possible to prevent an excessive load from being applied in series to the N-channel field-effect transistors N43 to N45, and it is possible to suppress an increase in the sizes of the N-channel field-effect transistors N43 to N45.

In the above-described embodiment, although the method has been described in which the number of the N-channel field-effect transistors N43 to N45 which can be used in pulling up the gate potential of the P-channel field-effect transistor PM is set to three, the above number may be set to four or greater.

Fifth Embodiment

Figure 8:
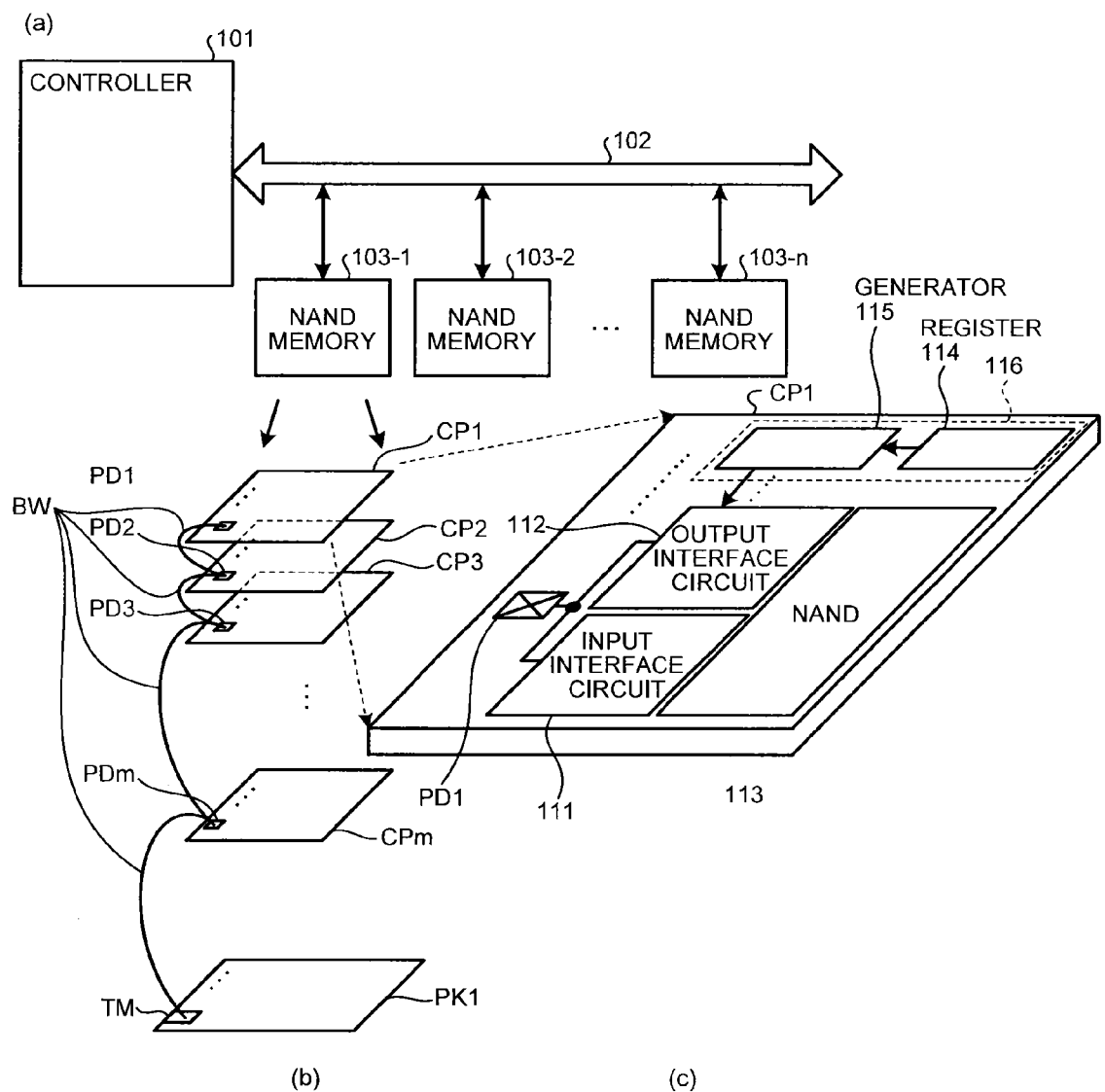
FIG. 8A is a block diagram schematically illustrating the configuration of a semiconductor storage device to which an interface circuit according to a fifth embodiment is applied.
FIG. 8B is a perspective view schematically illustrating the configuration of the NAND memory 103-1 of FIG. 8A.
FIG. 8C is a perspective view schematically illustrating the configuration of the semiconductor chip CP1 of the NAND memory 103-1 of FIG. 8B.

FIG. 8A is a block diagram schematically illustrating the configuration of a semiconductor storage device to which an interface circuit according to a fifth embodiment is applied, FIG. 8B is a perspective view schematically illustrating the configuration of the NAND memory 103-1 of FIG. 8A, and FIG. 8C is a perspective view schematically illustrating the configuration of the semiconductor chip CP1 of the NAND memory 103-1 of FIG. 8B.

In FIGS. 8A to 8C, the semiconductor storage device is provided with n (n is an integer of 2 or greater) NAND memories 103-1 to 103-n, and a controller 101 which controls the driving of the NAND memories 103-1 to 103-n. Examples of the control of the driving of the NAND memories 103-1 to 103-n include control of reading and writing from and on the NAND memories 103-1 to 103-n, block selection, error correction, and wear levelling.

The NAND memories 103-1 to 103-n are connected to the controller 101 in parallel through a channel 102. Here, for example, the NAND memory 103-1 is provided with m (m is an integer of 2 or greater) semiconductor chips CP1 to CPm. Each of the semiconductor chips CP1 to CPm has a NAND flash memory 113 mounted thereon, and pad electrodes PD1 to PDm, each of which is connected to the NAND flash memory 113, are formed, respectively. In the NAND flash memory 113, for example, a unit cell array, a decoder, a sense amplifier, a charge pump circuit, a page buffer, and the like can be provided.

In addition, each of the semiconductor chips CP1 to CPm is provided with an input interface circuit 111, an output interface circuit 112, and a rate setting portion 116. The input interface circuit 111 can transfer write data sent from the controller 101 and a control signal such as an address to the NAND flash memory 113 and the like. The output interface circuit 112 can transfer readout data read out from the NAND flash memory 113 and the like to the controller 101.

The output interface circuit 112 can use any of the configurations of FIGS. 1 and 5 to 7. In addition, the time lag generation circuit 7 of FIG. 3 may be added to the output interface circuit 112.

The rate setting portion 116 can independently set the turn-ON speeds and the turn-OFF speeds of a P-channel field-effect transistor PM and an N-channel field-effect transistor NM on the basis of parameter setting. Here, the rate setting portion 116 is provided with a resister 114 and a generator 115.

When the output interface circuit 112 uses the configuration of FIG. 1, values of intermediate voltages FN, FP, FNR, and FPR can be stored in the resister 114. At this time, the generator 115 can generate intermediate voltages FN, FP, FNR, and FPR on the basis of a value of the resister 114, and can supply the voltages to the output interface circuit 112.

When the output interface circuit 112 uses the configuration of FIG. 5, values of intermediate voltages FN and FP and selection signals CTP and CTN can be stored in the resister 114. At this time, the generator 115 can generate intermediate voltages FN and FP and selection signals CTP and CTN on the basis of a value of the resister 114, and can supply the voltages and signals to the output interface circuit 112.

When the output interface circuit 112 uses the configuration of FIG. 6, values of intermediate voltages FN and FP and selection signals CTP1, CTP2, CTN1, and CTN2 can be stored in the resister 114. At this time, the generator 115 can generate intermediate voltages FN and FP and selection signals CTP1, CTP2, CTN1, and CTN2 on the basis of a value of the resister 114, and can supply the voltages and signals to the output interface circuit 112.

When the output interface circuit 112 uses the configuration of FIG. 6, values of selection signals CTP1, CTP2, CTN1, CTN2, CTP1', CTP2', CTN1' and CTN2' can be stored in the resister 114. At this time, the generator 115 can generate selection signals CTP1, CTP2, CTN1, CTN2, CTP1', CTP2', CTN1' and CTN2' on the basis of a value of the resister 114, and can supply the signals to the output interface circuit 112.

The m semiconductor chips CP1 to CPm are mounted on one semiconductor package PK1, and an external terminal TM of the semiconductor package PK1 is shared with the pad electrodes PD1 to PDm of the m semiconductor chips CP1 to CPm. As a method of mounting the semiconductor chips CP1 to CPm on the semiconductor package PK1, a method of stacking the semiconductor chips CP1 to CPm, or a method of arranging the semiconductor chips CP1 to CPm on the same plane may be used. In addition, the semiconductor chips CP1 to CPm may be face-down-mounted, or may be face-up-mounted. In addition, as a method of sharing one external terminal TM with the m pad electrodes PD1 to PDm, the m pad electrodes PD1 to PDm and one external terminal TM can be connected using a bonding wire BW. Otherwise, the semiconductor chips CP1 to CPm may be flip-mounted, and the pad electrodes PD1 to PDm and the external terminal TM may be connected to each other through bump electrodes formed in the pad electrodes PD1 to PDm. Otherwise, penetration electrodes may be formed in the semiconductor chips CP1 to CPm, and the pad electrodes PD1 to PDm and the external terminal TM may be connected to each other through the penetration electrodes. The NAND memories 103-2 to 103-n other than the NAND memory 103-1 also have a similar configuration. In addition, the semiconductor storage device can be used as a storage device such as a memory card or SSD.

Figure 9:
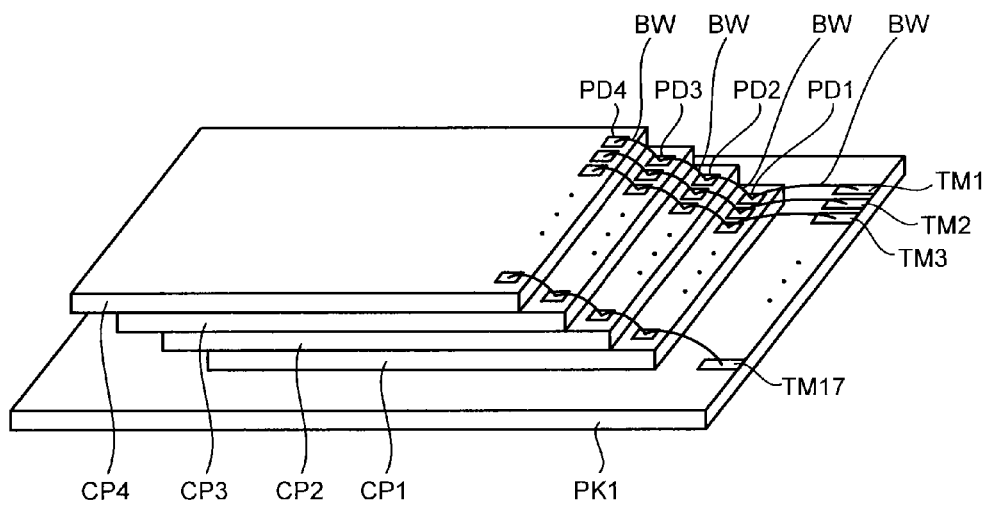
FIG. 9 is a perspective view schematically illustrating an example of the configuration of the NAND memory 103-1 of FIG. 8A.

FIG. 9 is a perspective view schematically illustrating an example of the configuration of the NAND memory 103-1 of FIG. 8A. In the example of FIG. 9, m is 4.

In FIG. 9, in semiconductor chips CP1 to CP4, pad electrodes PD1 to PD4 are formed, respectively. The pad electrodes PD1 to PD4 can be used as, for example, an address terminal, a read/write terminal, a chip select terminal, or a data terminal. In addition, in a semiconductor package PK1, external terminals TM1 to TM17 are formed. When the four semiconductor chips CP1 to CP4 are stacked and mounted on the semiconductor package PK1, the semiconductor chips CP1 to CP4 can be stacked stepwise so as to expose the pad electrodes PD1 to PD4. In addition, for example, one external terminal TM1 can be shared with the pad electrodes PD1 to PD4 of the four semiconductor chips CP1 to CP4 by connecting the pad electrodes PD1 to PD4 to the external terminal TM1 in common through a bonding wire BW.

FIG. 10 is a diagram illustrating an example of the pin arrangement of the semiconductor chip CP1 of FIG. 9.

In FIG. 10, for example, 29 pad electrodes PD1 can be provided in the semiconductor chip CP1. Here, $V_{SS}Q$, $V_{CC}Q$, DQ[0], DQ[1], DQ[2], DQ[3], $V_{SS}Q$, $V_{CC}Q$, DQS, /DQS, $V_{SS}Q$, $V_{CC}Q$, DQ[4], DQ[5], DQ[6], DQ[7], $V_{SS}Q$, $V_{CC}Q$, RE, /RE, VREF, VCC, VSS, /CE, CLE, ALE, /WE, /WP, and RB can be assigned to each pad electrode. VCC and VSS are power, $V_{SS}Q$ and $V_{CC}Q$ are I/O power, DQ[0], DQ[1], DQ[2], DQ[3], DQ[4], DQ[5], DQ[6], and DQ[7] are data signals, DQS and /DQS are data strobe signals, RE is a read enable signal, VREF is a reference signal, CE is a chip enable signal, CLE is a chip latch enable signal, ALE is an address latch enable signal, WE is a read/write signal, WP is a write protect signal, and RB is a ready/busy signal.

Here, each pad electrode to which DQ[0], DQ[1], DQ[2], DQ[3], DQ[4], DQ[5], DQ[6], DQ[7], DQS, and /DQS are assigned can be provided with an output interface circuit 112 having any of the configurations illustrated in FIGS. 1 and 5 to 7.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An interface circuit comprising:
   an output buffer electrically coupled to a pad electrode, the output buffer including a first transistor and a second transistor, the output buffer being configured to output waveform on the basis of the ON/OFF operation of the first transistor and the second transistor; and
   a driver circuit which is capable of independently changing a turn-ON speed or a turn-OFF speed of at least one of the first transistor and the second transistor.

2. The interface circuit according to claim 1,
   wherein the driver circuit includes a slew rate control unit which is capable of changing the turn-ON speed of at least one of the first transistor and the second transistor, and a reset rate control unit which is capable of changing the turn-OFF speed of at least one of the first transistor and the second transistor.

3. The interface circuit according to claim 2,
   wherein the first transistor is a first P-channel field-effect transistor and the second transistor is a first N-channel field-effect transistor which is connected to the first P-channel field-effect transistor in series, and
   the driver circuit is provided with a P-slew rate control unit which is capable of changing a turn-ON speed of the first P-channel field-effect transistor, a P-reset rate control unit which is capable of changing a turn-OFF speed of the first P-channel field-effect transistor, a N-slew rate control unit which is capable of changing a turn-ON speed of the first N-channel field-effect transistor, and a N-reset rate control unit which is capable of changing, a turn-OFF speed of the first N-channel field-effect transistor.

4. The interface circuit according to claim 3, further comprising:
   a time lag generation circuit which adds a period of time in order to turn off both of the first P-channel field-effect transistor and the first N-channel field-effect transistor at the same time.

5. The interface circuit according to claim 4, further comprising:
   a level shifter which is connected to a front stage of the time lag generation circuit.

6. The interface circuit according to claim 3,
   wherein the P-slew rate control unit is provided with a second N-channel field-effect transistor which pulls down a gate potential of the first P-channel field-effect transistor on the basis of an input voltage, and a third N-channel field-effect transistor which is connected to the second N-channel field-effect transistor in series and in which a first intermediate voltage independent from the input voltage is applied to a gate terminal,
   the P-reset rate control unit is provided with a second P-channel field-effect transistor which pulls up a gate potential of the first P-channel field-effect transistor on the basis of the input voltage, and a third P-channel field-effect transistor which is connected to the second P-channel field-effect transistor in series and in which a second intermediate voltage independent from the input voltage is applied to a gate terminal, the N-slew rate control unit is provided with a fourth P-channel field-effect transistor which pulls up a gate potential of the first N-channel field-effect transistor on the basis of the input voltage, and a fifth P-channel field-effect transistor which is connected to the fourth P-channel field-effect transistor in series and in which a third intermediate voltage independent from the input voltage is applied to a gate terminal, and
   the N-reset rate control unit is provided with a fourth N-channel field-effect transistor which pulls down a gate potential of the first N-channel field-effect transistor on the basis of the input voltage, and a fifth N-channel field-effect transistor which is connected to the fourth N-channel field-effect transistor in series and in which a fourth intermediate voltage independent from the input voltage is applied to a gate terminal.

7. The interface circuit according to claim 6, further comprising:
   a pad electrode which is connected to an output terminal of the output buffer.

8. The interface circuit according to claim 7,
   wherein readout data read out from a NAND flash memory is transferred to a controller.

9. The interface circuit according to claim 8,
   wherein a plurality of semiconductor chips which have the NAND flash memory formed therein are stacked, and the pad electrode is connected between the semiconductor chips through a bonding wire.

10. The interface circuit according to claim 9,
wherein the semiconductor chip is provided with a resister which stores values of the first to fourth intermediate voltages, and a generator which generates the first to fourth intermediate voltages on the basis of a value of the resister.

11. The interface circuit according to claim 3,
wherein the P-slew rate control unit is provided with a second N-channel field-effect transistor which pulls down a gate potential of the first P-channel field-effect transistor on the basis of an input voltage, and a third N-channel field-effect transistor which is connected to the second N-channel field-effect transistor in series and in which a first intermediate voltage independent from the input voltage is applied to a gate terminal,
the P-reset rate control unit is provided with a plurality of second P-channel field-effect transistors which are connected to each other in parallel so as to pull up a gate potential of the first P-channel field-effect transistor on the basis of the input voltage, and a first selection circuit which selects the number of the second P-channel field-effect transistors to be turned on at the time of pulling-up,
the N-slew rate control unit is provided with a third P-channel field-effect transistor which pulls up a gate potential of the first N-channel field-effect transistor on the basis of the input voltage, and a fourth P-channel field-effect transistor which is connected to the third P-channel field-effect transistor in series and in which a second intermediate voltage independent from the input voltage is applied to a gate terminal, and
the N-reset rate control unit is provided with a plurality of fourth N-channel field-effect transistors which are connected to each other in parallel so as to pull down a gate potential of the first P-channel field-effect transistor on the basis of the input voltage, and a second selection circuit which selects the number of the fourth N-channel field-effect transistors to be turned on at the time of pulling-down.

12. The interface circuit according to claim 11, further comprising:
a pad electrode which is connected to an output terminal of the output buffer.

13. The interface circuit according to claim 12,
wherein readout data read out from a NAND flash memory is transferred to a controller.

14. The interface circuit according to claim 13,
wherein a plurality of semiconductor chips which have the NAND flash memory formed therein are stacked, and the pad electrode is connected between the semiconductor chips through a bonding wire.

15. The interface circuit according to claim 14,
wherein the semiconductor chip is provided with a resister which stores values of the first and second intermediate voltages and values of selection signals of the first and second selection circuits, and a generator which generates the first and second intermediate voltages and the selection signals on the basis of a value of the resister.

16. The interface circuit according to claim 3,
wherein the P-slew rate control unit is provided with a plurality of second P-channel field-effect transistors which are connected to each other in parallel so as to pull down a gate potential of the first P-channel field-effect transistor on the basis of an input voltage, and a first selection circuit which selects the number of the second P-channel field-effect transistors to be turned on at the time of pulling-down,
the P-reset rate control unit is provided with a plurality of third P-channel field-effect transistors which are connected to each other in parallel so as to pull up a gate potential of the first P-channel field-effect transistor on the basis of the input voltage, and a second selection circuit which selects the number of the third P-channel field-effect transistors to be turned on at the time of pulling-up,
the N-slew rate control unit is provided with a plurality of second N-channel field-effect transistors which are connected to each other in parallel so as to pull up a gate potential of the first N-channel field-effect transistor on the basis of the input voltage, and a third selection circuit which selects the number of the second N-channel field-effect transistors to be turned on at the time of pulling-up, and
the N-reset rate control unit is provided with a plurality of third N-channel field-effect transistors which are connected to each other in parallel so as to pull down a gate potential of the first N-channel field-effect transistor on the basis of the input voltage, and a fourth selection circuit which selects the number of the third N-channel field-effect transistors to be turned on at the time of pulling-down.

17. The interface circuit according to claim 16, further comprising:
a pad electrode which is connected to an output terminal of the output buffer.

18. The interface circuit according to claim 17,
wherein readout data read out from a NAND flash memory is transferred to a controller.

19. The interface circuit according to claim 18,
wherein a plurality of semiconductor chips which have the NAND flash memory formed therein are stacked, and the pad electrode is connected between the semiconductor chips through a bonding wire.

20. The interface circuit according to claim 19,
wherein the semiconductor chip is provided with a resister which stores values of selection signals of the first to fourth selection circuits, and a generator which generates the selection signals of the first to fourth selection circuits on the basis of a value of the resister.

21. The interface circuit according to claim 11,
wherein the numbers of the second P-channel field-effect transistors and the fourth N-channel field-effect transistors to be turned on are changed on the basis of a power-supply voltage or an operation speed.

22. The interface circuit according to claim 16,
wherein the numbers of the third P-channel field-effect transistors and the third N-channel field-effect transistors to be turned on are changed on the basis of a power-supply voltage or an operation speed.

* * * * *